US007880856B2

(12) United States Patent  
Peng et al.

(10) Patent No.: US 7,880,856 B2
(45) Date of Patent: Feb. 1, 2011

(54) DISPLAY PANEL AND SHORT CIRCUIT DETECTION DEVICE THEREOF

(75) Inventors: Chung-Hung Peng, Hsinchu (TW); Meng-ying Hsieh, Hsinchu (TW); Chi-Hung Lu, Hsinchu (TW); Chin-Fon Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 960 days.

(21) Appl. No.: 11/735,506

(22) Filed: Apr. 16, 2007

(65) Prior Publication Data

US 2008/0157809 A1    Jul. 3, 2008

(30) Foreign Application Priority Data

Jan. 3, 2007    (TW)    ................. 96100206

(51) Int. Cl.
*G02F 1/13*    (2006.01)
(52) U.S. Cl. ................................. 349/192
(58) Field of Classification Search ........ None
See application file for complete search history.

(56) References Cited

U.S. PATENT DOCUMENTS

| 5,459,410 | A  | * | 10/1995 | Henley ..................... 324/770 |
| 6,437,341 | B1 | * | 8/2002  | Izumi et al. ............ 250/370.13 |
| 6,873,388 | B2 |   | 3/2005  | Tsukao et al. |
| 7,511,310 | B2 | * | 3/2009  | Arai et al. ..................... 257/88 |
| 2006/0125510 | A1 | * | 6/2006 | Brunner et al. ............. 324/770 |
| 2009/0225067 | A1 | * | 9/2009 | Yoda et al. .................. 345/211 |

* cited by examiner

*Primary Examiner*—Timothy Rude
(74) *Attorney, Agent, or Firm*—Jiang Chyun IP Office

(57) ABSTRACT

A pixel unit including a pixel electrode, a scan electrode, a common voltage electrode, a data electrode and at least one redundancy electrode is provided. During the fabricating process of the pixel unit, if a particle is simultaneously located between any two of the pixel electrode, the scan electrode and the common voltage electrode, it would cause a short circuit between the two electrodes. The pixel unit can generate a cross-shaped defect signal at the location where a short circuit happens when the pixel unit undergoes an array test or a cell test. The user can thereby quickly locate the defect and repair it.

11 Claims, 5 Drawing Sheets

US 7,880,856 B2

DISPLAY PANEL AND SHORT CIRCUIT DETECTION DEVICE THEREOF

CROSS-REFERENCE TO RELATED APPLICATION

This application claims the priority benefit of Taiwan application serial no. 96100206, filed on Jan. 3, 2007. All disclosure of the Taiwan application is incorporated herein by reference.

BACKGROUND OF THE INVENTION

1. Field of the Invention

The present invention relates to a detection device, especially to a short circuit detection device which identifies the location of a short circuit on a display panel.

2. Description of Related Art

Nowadays, the growing demand for computer, communication and consumer electronics products has ushered in an era termed as the 3C era. Conceivably, the market is filled with all kinds of information appliances such as mobile phones, personal digital assistants (PDAs), global positioning systems (GPSs), digital cameras and display apparatuses. In most information appliances, the flat panel display apparatus is used as the primary user interface.

Whereas almost all the conventional display apparatuses use the cathode ray tube as the primary user interface. With the advancement in the semiconductor fabricating techniques in recent years, the liquid crystal display apparatus is favored over the conventional cathode ray tube because it is lighter, thinner, more compact and consumes less power. Therefore, the liquid crystal display apparatus occupies a rather large share of the market.

FIG. 1 is a circuit diagram of a conventional pixel unit. Referring to FIG. 1, a conventional pixel unit 100 includes a scan electrode 102, a common voltage electrode 104, a data electrode 106 and a pixel electrode 108. Generally, the scan electrode 102 and the common voltage electrode 104 have different voltages. However, during the semiconductor fabricating process, if any particle (as shown by 110) falls on the scan electrode 102 and the common voltage electrode 104, a short circuit is caused between the two electrodes.

FIG. 2 illustrates the test result of a conventional pixel unit after an array test. Referring to FIG. 2, when a conventional pixel unit has a defect as shown in the pixel unit of FIG. 1, a short circuit is caused between the two electrodes. When the conventional pixel unit undergoes an array test or a cell test, it produces a horizontal-lined defect signal as shown by 210. However, the location of the defective pixel cannot be quickly and accurately identified according to this horizontal-lined defect signal 210. As a result, the testing time has to be prolonged and the production cost is increased correspondingly.

SUMMARY OF THE INVENTION

The present invention provides a display panel and a pixel unit thereof to help solve the above-mentioned problem. When the display panel undergoes an array test or a cell test, it can quickly and accurately locate a defective pixel unit.

From another aspect, the invention provides a short circuit detection device for detecting any short circuit happening between the scan electrode and the common voltage electrode or between the pixel electrode and the scan electrode of a display panel.

The invention provides a pixel unit disposed on a substrate. The pixel unit includes a pixel electrode, a scan electrode, a common voltage electrode, a data electrode and a redundancy electrode. The redundancy electrode is disposed either between the pixel electrode and the scan electrode or between the scan electrode and the common voltage electrode or at both positions, and coupled to the data electrode.

From another aspect, the invention provides a display panel including a substrate, a plurality of display areas and at least a redundancy electrode. A plurality of display areas is disposed on the substrate. Each of the display areas is surrounded by the data electrode, the scan electrode and the common voltage electrode. One pixel electrode is disposed in each of the display areas. In addition, the redundancy electrode is coupled to one of the data electrodes and disposed either between the pixel electrode and the scan electrode or between the scan electrode and the common voltage electrode or at both positions.

From yet another aspect, the invention provides a short circuit detection device, suitable for detecting whether any short circuit happens either between a scan electrode and a common voltage electrode or between a pixel electrode and a scan electrode in a display panel. The short circuit detection device includes a redundancy electrode and a connection plug. The redundancy electrode is coupled and disposed in a data electrode of the display panel and disposed either between the pixel electrode and the scan electrode or between the scan electrode and the common voltage electrode. The redundancy electrode has a hole. Furthermore, the hole includes a connection plug for coupling the redundancy electrode to the substrate of the display panel.

In summary, the redundancy electrode of the present invention is disposed either between the pixel electrode and the scan electrode or between the scan electrode and the common voltage electrode or at both positions so as to quickly and accurately identify the location of a defective pixel. Thereby, the user can repair it more effectively.

In order to the make the aforementioned and other objects, features and advantages of the present invention more comprehensible, preferred embodiments accompanied with figures are described in detail below.

DESCRIPTION OF EMBODIMENTS

Figure 3:
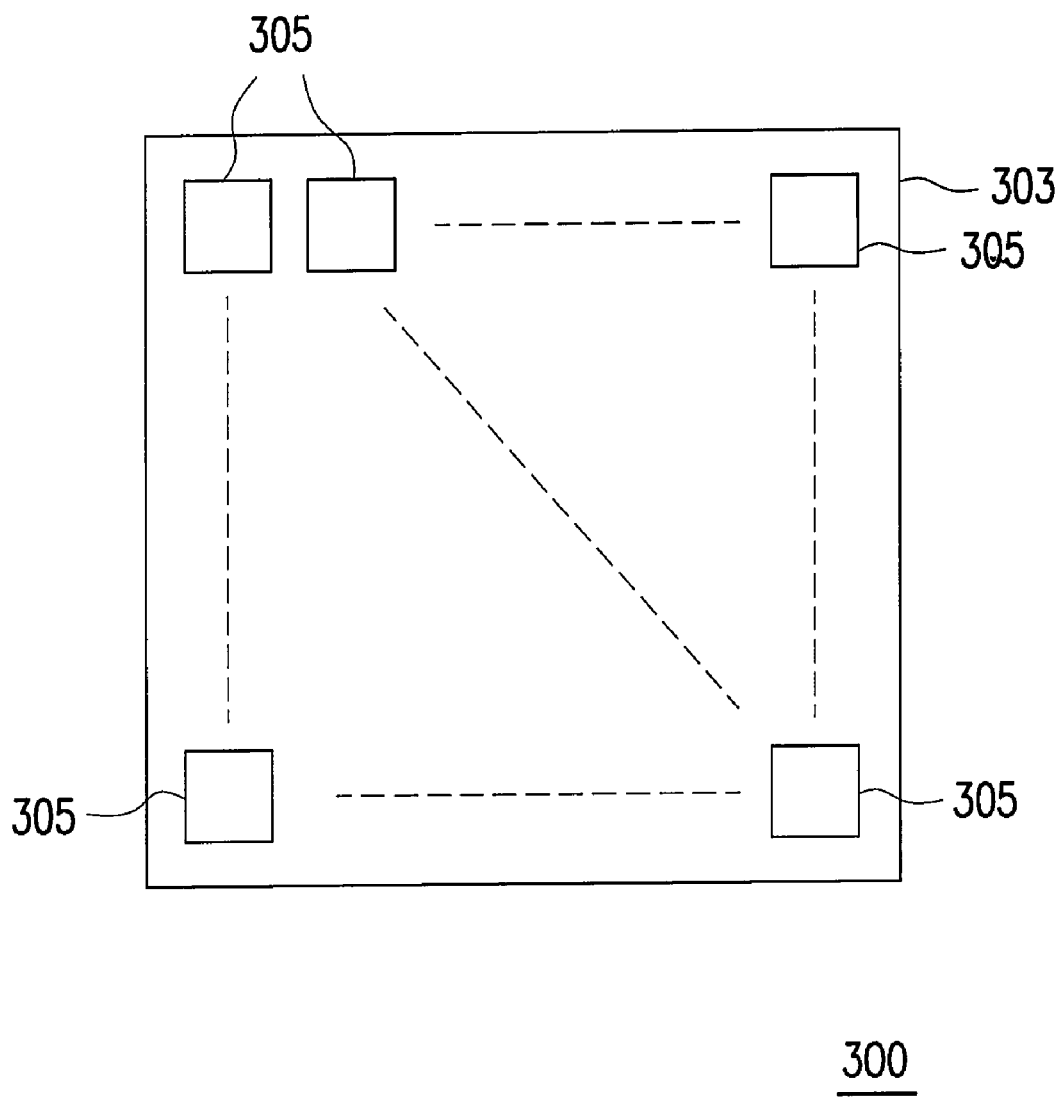
FIG. 3 illustrates a circuit diagram of a display panel according to one preferred embodiment of the invention.

FIG. 3 illustrates a circuit diagram of a display panel according to one preferred embodiment of the present invention. Referring to FIG. 3, a display panel 300 of the invention includes a substrate 303 and a plurality of display areas 305. The plurality of display areas 305 is arranged as an array and disposed on the substrate 303.

Figure 4:
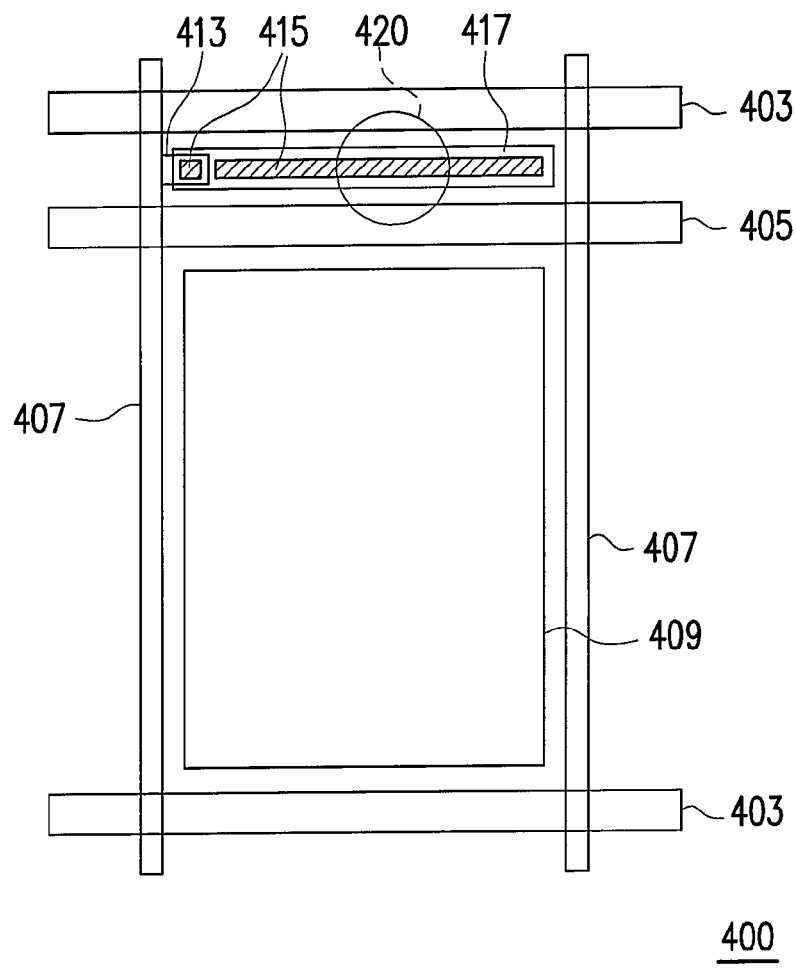
FIG. 4 illustrates a circuit diagram of a pixel unit according to one preferred embodiment of the invention.

FIG. 4 illustrates a circuit diagram of a pixel unit according to one preferred embodiment of the invention. The circuit diagram may apply to the display areas 305 of FIG. 3. Referring to FIG. 4, a pixel unit 400 of the invention includes a common voltage electrode 403, a scan electrode 405, a pixel electrode 409, a data electrode 407 and a redundancy electrode 413. It is well-known that the extension direction of the scan electrode 405 may be parallel to the extension direction of the common voltage electrode 403 and substantially perpendicular to the extension direction of the data electrode 407. The extension direction of the scan electrode 405 and the extension direction of the data electrode 407 do not contact each other. The pixel electrode 409 is disposed in the area surrounded by the scan electrode 405, the data electrode 407 and the common voltage electrode 403.

It is noted that a short circuit detection device is further disposed on the data electrode 407 so as to detect if a short circuit happens between the scan electrode 405 and the common voltage electrode 403. The short circuit detection device provided by the invention includes a redundancy electrode 413. The redundancy electrode 413 includes a hole 415. A connection plug 417 is further disposed inside the hole 415 and thereby couples the redundancy electrode 413 to the substrate. Moreover, in the invention, the common voltage electrode 403 is coupled to a common voltage.

Still referring to FIG. 4, during the fabricating process of the pixel unit 400, if a particle 420 is located between the scan electrode 405 and the common voltage electrode 403, it would result in a short circuit between the scan electrode 405 and the common voltage electrode 403. In the present embodiment, since the redundancy electrode 413 is disposed between the scan electrode 405 and the common voltage electrode 403 and the redundancy electrode 413 is coupled to the data electrode 407, it causes a short circuit in the scan electrode 405, the common voltage electrode 403, and the redundancy electrode 413 when the particle 420 is simultaneously located between the scan electrode 405 and the common voltage electrode 403.

Figure 1:
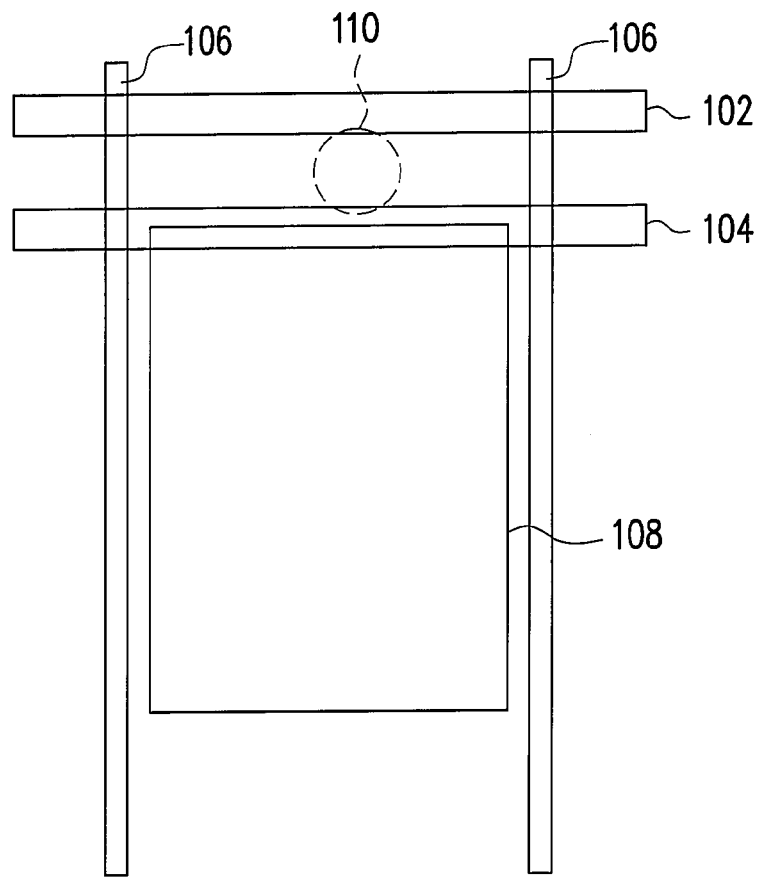
FIG. 1 is a circuit diagram of a conventional pixel unit.
Figure 2:
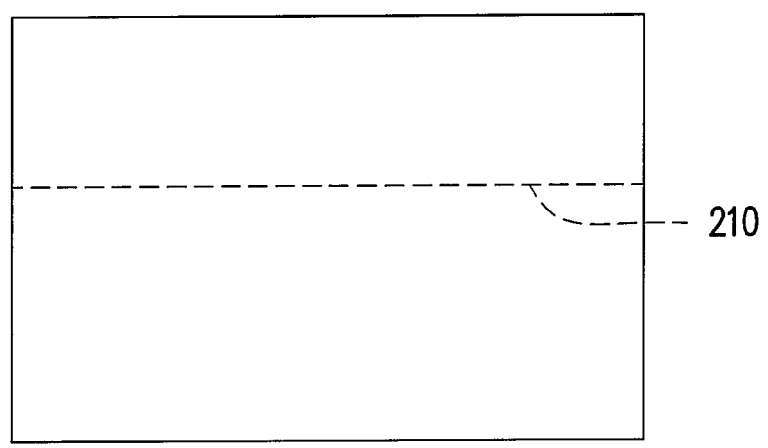
FIG. 2 illustrates the test result of a conventional pixel unit after an array test.
Figure 5:
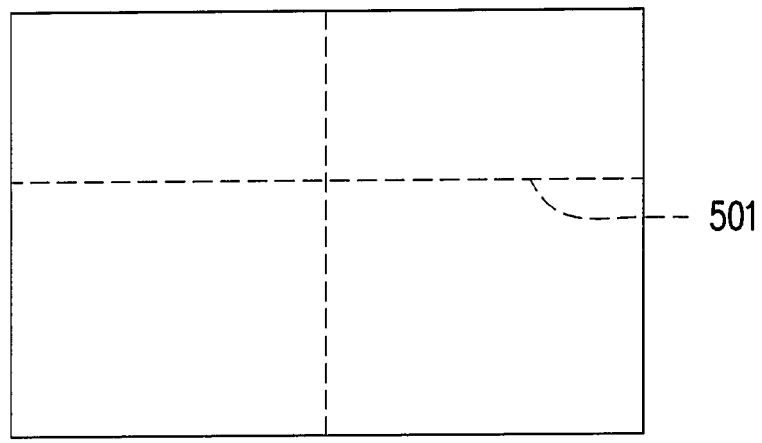
FIG. 5 illustrates the test result of a pixel unit according to one embodiment of the present invention after an array test.

FIG. 5 illustrates the test result of the pixel unit of the present embodiment after an array test. Referring to both FIGS. 4 and 5, when the pixel unit 400 is driven, if the pixel unit 400 has the defect as shown in FIG. 1, it would result in that all the scan electrode 405, the common voltage electrode 403 and the data electrode 407 have the same voltage potential. Therefore, when the defective pixel unit 400 undergoes an array test or a cell test, it generates a cross-shaped defect signal 501. Thus, the user can precisely identify the location of the defect according to the cross-shaped defect signal 501 and thereby repair it.

Figure 6:
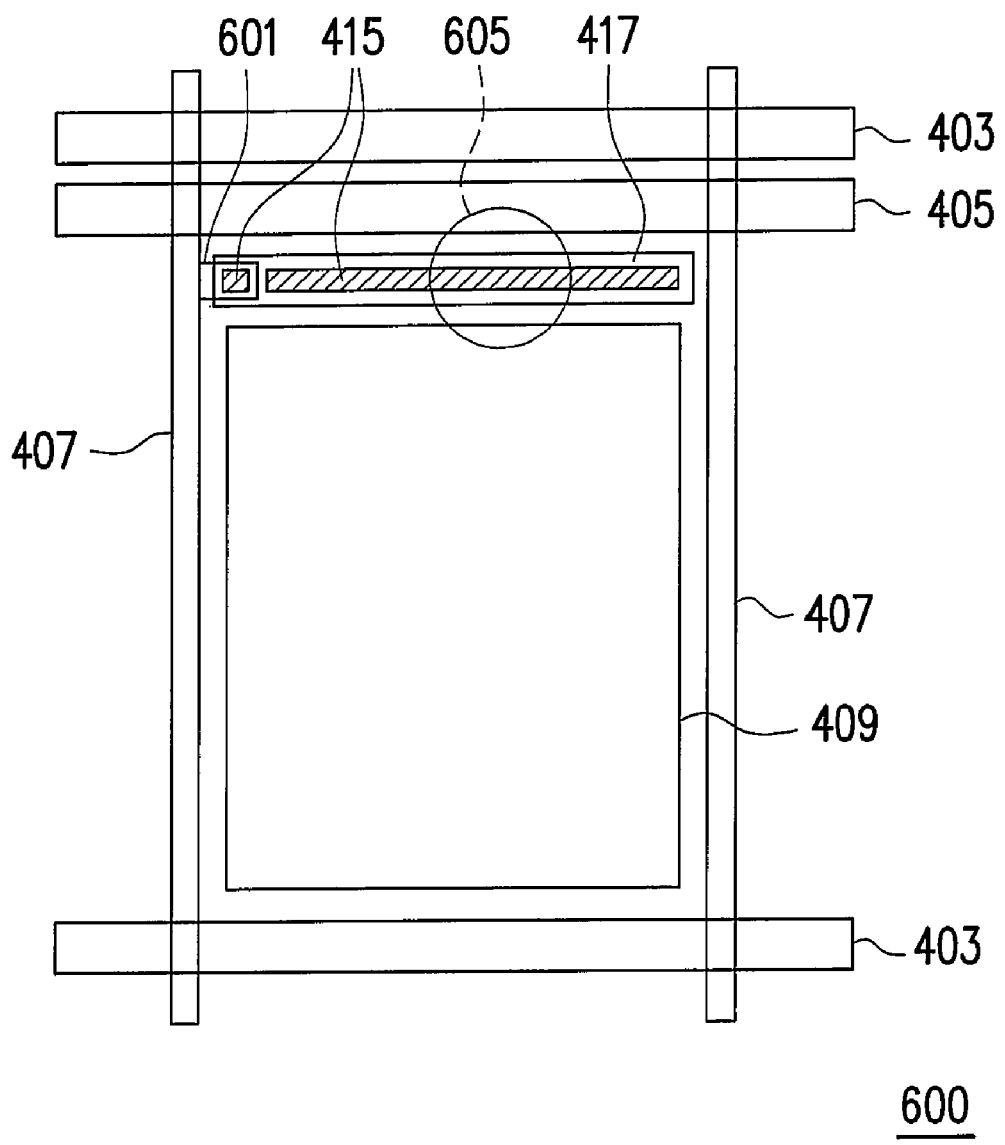
FIG. 6 illustrates a circuit diagram of another pixel unit in the invention.

FIG. 6 illustrates a circuit diagram of another pixel unit of the invention. The circuit diagram may apply to the display areas 305 of FIG. 3. Referring to FIG. 6, the element in FIG. 6 bearing the same number as the pixel unit of FIG. 4 has the same function and operating principle as those of the said pixel unit. The difference between a pixel unit 600 of the present embodiment and the pixel unit of the first embodiment is that a redundancy electrode 601 is disposed between the scan electrode 405 and the pixel electrode 409. Additionally, when a particle 605 is simultaneously located between the scan electrode 405 and the pixel electrode 409, people who are skilled in the art can infer from the description of FIG. 4 the location where a defect occurs.

Figure 7:
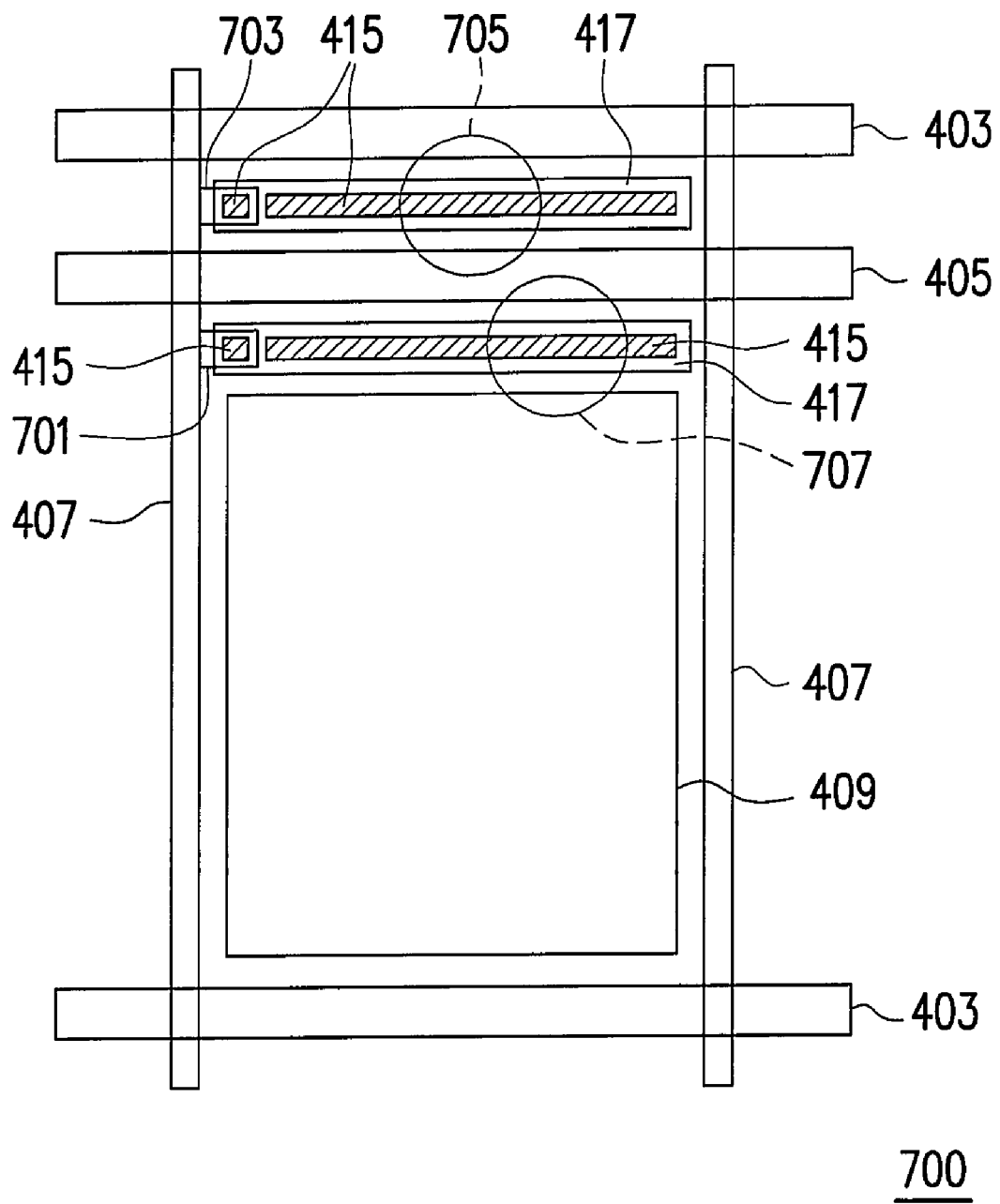
FIG. 7 illustrates a circuit diagram of another pixel unit in the invention.

FIG. 7 illustrates a circuit diagram of another pixel unit of the invention. The circuit diagram may apply to the display areas 305 of FIG. 3. Referring to FIG. 7, the element in FIG. 7 bearing the same number as the pixel unit of FIG. 4 has the same function and operating principle as those of the said pixel unit. The difference between a pixel unit 700 of the present embodiment and the pixel unit of the first embodiment is that redundancy electrodes 701 and 703 are respectively disposed between the scan electrode 405 and the pixel electrode 409 and between the scan electrode 405 and the common voltage electrode 403. Moreover, when particles 705 and 707 are simultaneously located between the scan electrode 405 and the pixel electrode 409, and between the scan electrode 405 and the common voltage electrode 403, people skilled in the art should be able to infer from the description of FIG. 4 the location where a defect occurs.

In summary, the pixel unit of the display panel in the invention includes at least a redundancy electrode. When a particle is located between any two of the electrodes of the pixel unit, it results in short circuits among the pixel electrode, the scan electrode and the data electrode. Hence, when a defective pixel unit undergoes an array test or a cell test, the pixel unit generates a cross-shaped defect signal. The user thereby quickly identifies the location of the defect and repairs it.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A pixel unit disposed on a substrate, the pixel unit comprising:
   a pixel electrode;
   a scan electrode;
   a common voltage electrode;
   a data electrode; and
   at least a redundancy electrode disposed either between the pixel electrode and the scan electrode or between the scan electrode and the common voltage electrode or at both positions, and electrically coupled to the data electrode.

2. The pixel unit of claim 1, wherein the extension direction of the common voltage electrode is substantially parallel to the extension direction of the scan electrode.

3. The pixel unit of claim 1, wherein the extension direction of the data electrode is substantially parallel to the extension direction of the scan electrode.

4. The pixel unit of claim 1, wherein the redundancy electrode has a hole and comprises a connection plug disposed in the hole and used for coupling the redundancy electrode to the substrate.

5. A display panel, comprising:
   a substrate;
   a plurality of display areas disposed on the substrate, each of the display areas being surrounded by the data electrode, the scan electrode and the common voltage electrode, wherein each of the display areas comprises a pixel electrode; and
   at least one redundancy electrode coupled to one of the data electrodes and disposed either between the pixel electrode and the scan electrode or between the scan electrode and the common voltage electrode or at both positions.

6. The display panel of claim 5, wherein the extension direction of the common voltage electrode is substantially parallel to the extension direction of the scan electrode.

7. The display panel of claim 5, wherein the extension direction of the data electrode is substantially parallel to the extension direction of the scan electrode.

8. The display panel of claim 5, wherein the common voltage electrode is coupled to a common voltage.

9. The display panel of claim 5, wherein the redundancy electrode has a hole and comprises a connection plug disposed in the hole and used for coupling the redundancy electrode to the substrate.

10. A short circuit detection device for detecting whether a short circuit happens between a scan electrode and a common voltage electrode or between a pixel electrode and the scan electrode in a display panel, the short circuit detection device comprising:

a redundancy electrode coupled to a data electrode in the display panel and disposed either between the pixel electrode and the scan electrode or between the scan electrode and the common voltage electrode or at both positions, the redundancy electrode having a hole; and a connection plug disposed in the hole and used for coupling the redundancy electrode to the substrate of the display panel.

11. The short circuit detection device of claim 10, wherein the display panel comprises a liquid crystal display panel.

* * * * *